United States Patent
Yang et al.

(10) Patent No.: US 9,893,669 B2
(45) Date of Patent: Feb. 13, 2018

(54) MOTOR EFFICIENCY ANALYSIS METHOD FOR MOTOR INVERTER

(71) Applicant: INDUSTRIAL TECHNOLOGY RESEARCH INSTITUTE, Hsin-chu (TW)

(72) Inventors: Chun-Hsiang Yang, Taipei (TW); Yung-Ren Cheng, Hsinchu (TW); Chin-Hung Kuo, Hsinchu (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 104 days.

(21) Appl. No.: 14/815,385

(22) Filed: Jul. 31, 2015

(65) Prior Publication Data
US 2016/0268947 A1    Sep. 15, 2016

(30) Foreign Application Priority Data
Mar. 13, 2015 (TW) .............................. 104108134 A

(51) Int. Cl.
*H02P 27/04* (2016.01)
*H02P 27/06* (2006.01)
(Continued)

(52) U.S. Cl.
CPC ............ *H02P 27/06* (2013.01); *G01R 31/343* (2013.01); *H02P 23/14* (2013.01); *Y02P 80/116* (2015.11)

(58) Field of Classification Search
CPC .......... H02K 17/04; H02K 3/28; H02P 27/06; H02P 27/08; H02M 5/4505
(Continued)

(56) References Cited

U.S. PATENT DOCUMENTS 4,207,510 A * 6/1980 Woodbury ................ H02P 6/08
                                                    318/802
4,450,398 A * 5/1984 Bose ........................ H02P 21/09
                                                    318/803
(Continued)

FOREIGN PATENT DOCUMENTS

CN     101378241 A    3/2009
CN     101860127 A    10/2010
(Continued)

OTHER PUBLICATIONS

Bin Lu et al., A survey of efficiency-estimation methods for in-service induction motors, IEEE Transactions on Industry Applications, 2006, 924-933, vol. 42, No. 4.
(Continued)

*Primary Examiner* — Rina Duda
(74) *Attorney, Agent, or Firm* — Locke Lord LLP; Tim Tingkang Xia, Esq.

(57) ABSTRACT

The present invention discloses a motor efficiency analysis method for motor inverter. The method can be performed via a real-time motor operation efficiency display device. Based on the measured primary current signal and the voltage provided by the driving device, the device can estimate related data, such as the real-time efficiency, rotational speed, torque and stator resistance, by means of several algorithms. Besides, the device is designed to be applied to most motors; therefore, users can manage the efficiency of all motors of the factory without the need to stop the machines or the manufacturing process.

7 Claims, 2 Drawing Sheets

(51) Int. Cl.
*H02P 23/14* (2006.01)
*G01R 31/34* (2006.01)

(58) Field of Classification Search
USPC .............................. 318/432, 727, 797, 801
See application file for complete search history.

(56) References Cited

U.S. PATENT DOCUMENTS

| | | | |
|---|---|---|---|
| 5,262,717 A | 11/1993 | Bolegoh | |
| 5,661,386 A | 8/1997 | Kueck et al. | |
| 6,308,140 B1* | 10/2001 | Dowling | G01R 31/343 324/765.01 |
| 6,676,400 B2* | 1/2004 | Ito | B29C 45/76 318/801 |
| 6,862,538 B2* | 3/2005 | El-Ibiary | G01R 31/34 702/38 |
| 7,075,264 B2 | 7/2006 | Huggett et al. | |
| 7,135,830 B2* | 11/2006 | El-Ibiary | H02P 29/664 318/560 |
| 7,184,902 B2* | 2/2007 | El-Ibiary | H02P 23/14 702/60 |
| 7,659,685 B2 | 2/2010 | Cesario et al. | |
| 7,679,310 B2* | 3/2010 | Schulz | B60L 15/08 318/799 |
| 7,772,716 B2 | 8/2010 | Shaver, II et al. | |
| 8,450,995 B2 | 5/2013 | Wagner | |
| 2005/0116836 A1 | 6/2005 | Perry et al. | |
| 2008/0298784 A1 | 12/2008 | Kastner | |
| 2009/0243522 A1 | 10/2009 | Suhama et al. | |

FOREIGN PATENT DOCUMENTS

| | | |
|---|---|---|
| TW | I227325 B | 2/2005 |
| TW | I264544 B | 10/2006 |
| TW | I273515 B | 2/2007 |
| TW | I273996 B | 2/2007 |
| TW | I316608 B | 11/2009 |
| TW | 201008081 A | 2/2010 |
| TW | 201100832 A | 1/2011 |
| TW | I421178 B | 1/2014 |
| TW | I475238 B | 3/2015 |

OTHER PUBLICATIONS

V.P. Sakthivel et al., On-site efficiency evaluation of three-phase induction motor based on particle swarm optimization, Energy, 2011, 1713-1720, 36.

V.P. Sakthivel et al., An accurate and economical approach for induction motor field efficiency estimation using bacterial foraging algorithm, Measurement, 2011, 674-684, 44.

V. Prakash et al., A novel efficiency improvement measure in three-phase induction motors, its conservation and potential economic analysis, Energy for Sustainable Development, 2008, 78-87, vol. XII, No. 2.

Mehmet Cunkas et al., Efficiency determination of induction motors using multi-objective evolutionary algorithms, Advances in Engineering Software, 2010, 255-261, 41.

Tero Ahonen et al., Centrifugal pump operation monitoring with motor phase current measurement, Electrical Power and Energy Systems, 2012, 188-195, 42.

Intellectual Property Office, Ministry of Economic Affairs, R.O.C., "Office Action", dated Feb. 17, 2016, Taiwan.

* cited by examiner

MOTOR EFFICIENCY ANALYSIS METHOD FOR MOTOR INVERTER

CROSS REFERENCE TO RELATED APPLICATION

This application also claims priority to Taiwan Patent Application No. 104108134 filed in the Taiwan Patent Office on Mar. 13, 2015, the entire content of which is incorporated herein by reference.

TECHNICAL FIELD

The present disclosure relates to a motor efficiency analysis method for motor inverter, and more particularly is a method based on a measured primary current signal and the voltage provided by a driving device for estimating related data at current load, including rotational speed, torque and stator resistance, etc., by means of several algorithms, and thus to be used in a calculation for obtaining a real-time motor efficiency.

BACKGROUND

Generally, despite that there can be various manufacturing machines used in a factory, any of them can be simply treated as a combination of motors and related transmission systems. Based upon an analysis made by Baldor Electric Company at Year 2001, while considering the cost of electricity used by a motor over its whole working lifetime, it is realized that almost 98% of energy consumed by the motor is wasted, and therefore, it is importance to effectively obtain and control the real-time operating efficiency of all the motors used in the factory so as to be able to gain better energy saving results.

However, facing various motors of different brands and types that can not be stopped for inspection and maintenance at any time and at will, the engineers in charge of energy management in a factory who are generally short of tools for on-line efficiency estimation are not able to obtain the real-time operating conditions of all the motors in the factory, including their electric consumption, operating efficiency and mechanical properties, and thus, the energy management operations are generally performed based upon the experience of the engineers. Currently, for some factories with better energy conservation plans, motors are inspected and maintained in their schedules annual maintenance periods, but for those without good energy conservation plans, the inspection and maintenance operations are only performed during sudden motor malfunctions. Consequently, not only the overall motor operating efficiency is adversely affected, but also the whole production scheduling and planning can be procrastinated. Nevertheless, eventually the factory will suffer higher maintenance cost. Therefore, it is in need of an on-line motor efficiency estimation tool that can be provided to the energy management engineer for obtaining the real-time operating conditions of all the motors in the factory, and thus any motor that is performed poorly and is able to break down can be maintained in time in a preventive manner.

According to most recent market analysis and patent search, there is no similar means or device that is coupled to drivers and is able to display real-time motor efficiency. Primarily, the present disclosure is a motor efficiency analysis method and a device using the method, that both are based on a measured primary current signal and the voltage provided by a driving device for estimating related data at current load, is including rotational speed, torque and stator resistance, etc., by means of several algorithms, and thus to be used in a calculation for obtaining a real-time motor efficiency. Thereby, motors operating in a factory that can not be stopped for inspection and maintenance can be monitored at all time for enabling better motor efficiency management in the factory. In addition, as the motor efficiency analysis method of the present disclosure has innovatively taken the effect of real-time stator resistance $R_s$ variation into the formula, a more accurate efficiency estimation can be achieved. Moreover, since a data register method is adopted for rotation speed estimation, a real-time efficiency is achievable without requiring the use of a powerful core processing ability for performing embedded data processing.

SUMMARY

The present disclosure is a motor efficiency analysis method for motor inverter, and is primarily related to the use of an inverter to drive a motor for bringing in an embedded system to be coupled to the inverter. Thereby, the hardware used for efficiency measurement can be simplified and is highly conforming to industry requirements. Consequently, motors operating in a factory that can not be stopped for inspection and maintenance can be monitored at all time for enabling better motor efficiency management in the factory.

The present disclosure provides a motor efficiency analysis method for motor inverter, comprising the steps of:

measuring a primary current signal after activating a motor;

using an analog-to-digital converter for transforming the primary current signal into a digital signal while registering the digital signal in a data register;

enabling a data processing unit to access a current signal from the data register as well as a voltage signal and a frequency signal from a motor inverter to be used in a data process operation so as to obtain a rotation speed signal; and using the rotation speed signal in a loss estimation, a stator-flux estimation and a torque estimation for obtaining an operating efficiency value.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
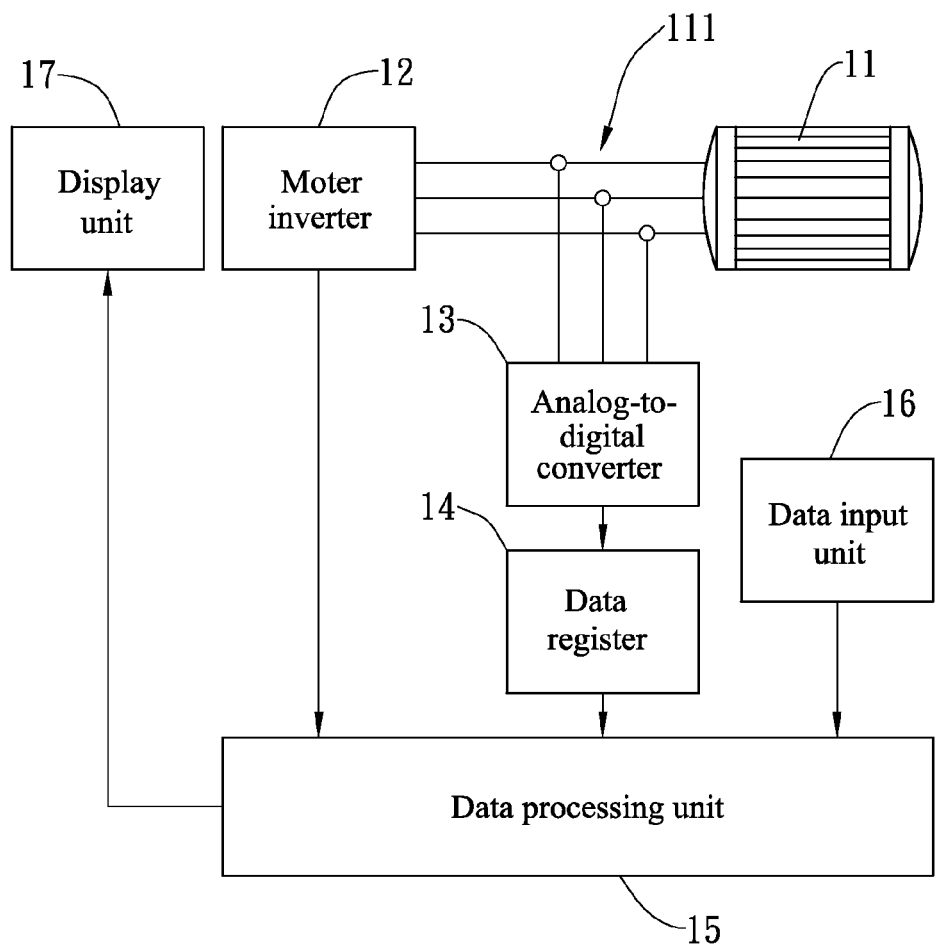
FIG. 1 is a block diagram showing a circuit for enabling a motor efficiency analysis method for motor inverter according to the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a block diagram showing a circuit for enabling a motor efficiency analysis method for motor inverter according to the present disclosure. In FIG. 1, a motor 11 is connected to a motor inverter 12 at its the primary side 111, while the primary side 111 is further connected to an analog-to-digital (A/D) converter 13, by that a measured analog current signal is transformed into digital signal so as to be registered in a data register 14. Moreover, a data processing unit 15 is used to access a current signal from the data register 14 as well as a voltage signal and a frequency signal from the motor inverter 12 to be used in a data processing operation so as to obtain a rotation speed signal. However, in a condition when the voltage signal can not be gathered effectively, it can be replaced by a voltage value from a data input unit 16. Thereafter, the operating efficiency value being calculated and obtained from the data processing unit 15 is outputted to a display unit 17 for displaying.

Figure 2:
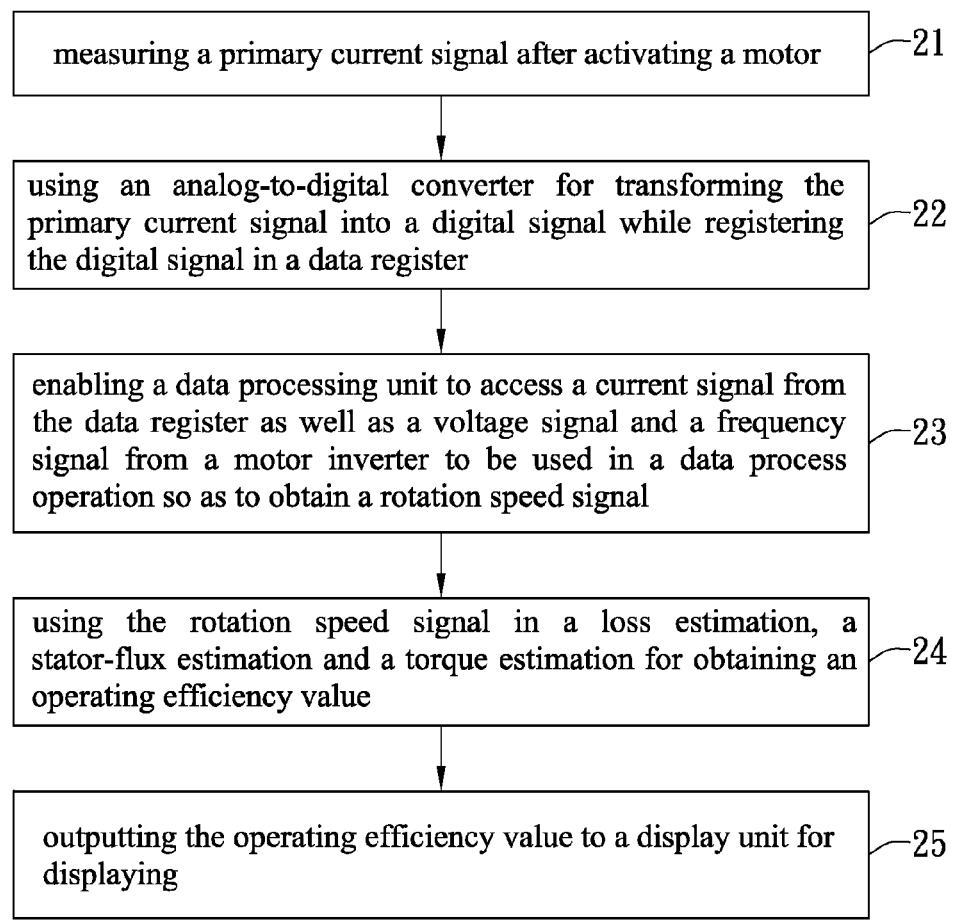
FIG. 2 is a flow chart depicting steps performed in a motor efficiency analysis method for motor inverter of the present disclosure.

Please refer to FIG. 2, which is a flow chart depicting steps performed in a motor efficiency analysis method for motor inverter of the present disclosure. As shown in FIG. 2, the method of the present disclosure comprises the following steps:

Step 21: measuring a primary current signal after activating a motor;

Step 22: using an analog-to-digital converter for transforming the primary current signal into a digital signal while registering the digital signal in a data register for improving calculation rate;

Step 23: enabling a data processing unit to access a current signal from the data register as well as a voltage signal and a frequency signal from a motor inverter to be used in a data process operation so as to obtain a rotation speed signal;

Step 24: using the rotation speed signal in a loss estimation, a stator-flux estimation and a torque estimation for obtaining an operating efficiency value, whereas the loss estimation further includes a calculation of stator resistance $R_s$ variation and a calculation of active/reactive power; and Step 25: outputting the operating efficiency value to a display unit for displaying.

In embodiments of the present disclosure, the display unit can be a built-in unit of the motor inverter; or can be configured inside an external circuit module that is connected to the motor inverter. In addition, the data processing unit can be a device that is configured in a manner selected from the group consisting of: it is a built-in unit of the motor inverter, and it is an external device connected to the motor inverter.

In the step 24, the stator-flux estimation is performed using the following formula:

$$\lambda_\alpha = \int e_\alpha dt = \int (v_\alpha - R_s i_\alpha) dt;$$

$$\lambda_\beta = \int e_\beta dt = \int (v_\beta - R_s i_\beta) dt;$$

wherein, $\lambda_\alpha$ is the stator resistor of α phase;
$\lambda_\beta$ is the stator resistor of β phase;
$e_\alpha$ is the electric field intensity of α phase;
$e_\beta$ is the electric field intensity of βphase;
$v_\alpha$ is the voltage of α phase;
$v_\beta$ is the voltage of β phase;
$i_\alpha$ is the current of α phase;
$i_\beta$ is the current of βphase;
$R_s$ is the stator resistance.

In the step 24, the torque estimation is performed using the following formula:

$$T_e = \frac{3}{2} \frac{\text{Pole}}{2} (\lambda_\alpha i_\beta - \lambda_\beta i_\alpha);$$

$$P_G = T_e \times \omega_r;$$

wherein, $T_e$ is the torque;
Pole is the magnetic pole;
$\lambda_\alpha$ is the stator-flux of α phase;
$\lambda_\beta$ is the stator-flux of βphase;
$P_G$ is the electromagnetic power;
$\omega_r$ is the rotation speed, which is obtained based upon the stator current harmonic component of the rotation speed frequency.

In the step 24, the operating efficiency value is obtained using the following formula:

$$P_{Out} = P_G - P_{iron};$$

$$P_{in} = \frac{1}{T} \int_0^T (V_\alpha i_\alpha + V_\beta i_\beta) dt;$$

$$\eta = P_{Out}/P_{in};$$

wherein, $v_\alpha$ is the voltage of α phase;
$v_\beta$ is the voltage of β phase;
$i_\alpha$ is the current of α phase;
$i_\beta$ is the current of βphase;
T is the period;
$P_{Out}$ is the air gap power;
$P_G$ is the electromagnetic power;
$P_{iron}$ is the iron loss power;
$P_{in}$ is the input power;
η is the operating efficiency.

The motor efficiency analysis method for motor inverter of the present disclosure has the following advantages:

(1) In a motor efficiency estimation, after considering the power loss caused by factors, such as stator resistance $R_s$ variation, the error of the motor efficiency estimation is reduced to lower than 2%.

(2) In a motor efficiency estimation, the addition of the data register increases the feasibility for achieving a current frequency analysis.

(3) Using the method of the present disclosure, the measurement of a primary three-phase current is required to be performed only once and used with the matching voltage value from a driving unit, the motor operating efficiency at the current load can be obtained.

(4) Using the method of the present disclosure, a real-time motor operating efficiency display device for motor inverters can be adapted for any operating factories, and thereby, motors operating in a factory that can not be stopped for inspection and maintenance can be monitored at all time for enabling better motor efficiency management in the factory.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A motor efficiency analysis method for a motor inverter, comprising the steps of:
    measuring a primary current signal after activating a motor, wherein the primary current signal is a current signal measured at a primary side of the motor;
    using an analog-to-digital converter for transforming the primary current signal into a digital signal while registering the digital signal in a data register;
    accessing a current signal from the data register, measuring a voltage signal and a frequency signal from the motor inverter, and using the current signal, the voltage signal and the frequency signal directly to obtain a rotation speed signal; and
    using the rotation speed signal in a loss estimation, a stator-flux estimation and a torque estimation for obtaining an operating efficiency value, wherein the stator-flux estimation is to calculate a stator resistor of α phase according to a voltage of α phase, a current of α phase and a stator resistance, and calculate a stator resistor of β phase according to a voltage of β phase, a current of β phase and the stator resistance by a data processing unit,
    wherein the motor inverter is connected to the motor and the data processing unit; and
    wherein one side of the analog-to-digital converter is connected to the primary side of the motor, and the other side of the analog-to-digital converter is connected to the data register that is connected to the date processing unit.

2. The motor efficiency analysis method of claim 1, further comprising a step of:
    outputting the operating efficiency value to a display unit for displaying.

3. The motor efficiency analysis method of claim 2, wherein the display unit is built in the motor inverter.

4. The motor efficiency analysis method of claim 2, wherein the display unit is configured in an external circuit module while the external circuit module is connected to the motor inverter.

5. The motor efficiency analysis method of claim 1, wherein the loss estimation further comprises: a calculation of stator resistance variation and a calculation of active/reactive power.

6. The motor efficiency analysis method of claim 1, wherein the data processing unit is a device that is configured in a manner selected from the group consisting of: it is a built-in unit of the motor inverter, and it is an external device connected to the motor inverter.

7. The motor efficiency analysis method of claim 1, wherein the data register is provided for storing the result of the measuring of the primary current signal, and thereby, the operating efficiency value is improved.

* * * * *